United States Patent
Foote

(10) Patent No.: US 7,589,397 B1
(45) Date of Patent: Sep. 15, 2009

(54) SYSTEM AND METHOD FOR PROVIDING A UNIFORM OXIDE LAYER OVER A LASER TRIMMED FUSE WITH A DIFFERENTIAL WET ETCH STOP TECHNIQUE

(75) Inventor: Richard W. Foote, Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 67 days.

(21) Appl. No.: 11/811,567

(22) Filed: Jun. 11, 2007

Related U.S. Application Data

(62) Division of application No. 10/781,166, filed on Feb. 18, 2004, now Pat. No. 7,238,620.

(51) Int. Cl.
*H01L 23/58* (2006.01)

(52) U.S. Cl. ............... 257/632; 257/E27.063

(58) Field of Classification Search ......... 257/528–530, 257/632–635, E27.063
See application file for complete search history.

(56) References Cited

U.S. PATENT DOCUMENTS

| | | | |
|---|---|---|---|
| 4,217,570 A | 8/1980 | Holmes | |
| 4,413,272 A | 11/1983 | Mochizuki et al. | |
| 4,455,194 A | 6/1984 | Yabu et al. | |
| 4,602,420 A | 7/1986 | Saito | |
| 5,096,850 A | 3/1992 | Lippitt, III | |
| 5,116,778 A | 5/1992 | Haskell et al. | |
| 5,232,874 A | 8/1993 | Rhodes et al. | |
| 5,235,205 A | 8/1993 | Lippitt, III | |
| 5,258,096 A | 11/1993 | Sandhu et al. | |
| 5,272,117 A * | 12/1993 | Roth et al. | 438/14 |
| 5,538,924 A | 7/1996 | Chen | |
| 5,585,662 A | 12/1996 | Ogawa | |
| 5,598,027 A | 1/1997 | Matsuura | |
| 5,821,160 A | 10/1998 | Rodriguez et al. | |
| 5,849,635 A | 12/1998 | Akram et al. | |
| 5,872,390 A | 2/1999 | Lee et al. | |
| 5,895,963 A | 4/1999 | Yamazaki | |
| 6,017,824 A | 1/2000 | Lee et al. | |
| 6,025,214 A | 2/2000 | Reddy et al. | |
| 6,046,488 A | 4/2000 | Kawasaki et al. | |

(Continued)

OTHER PUBLICATIONS

Simon S. Cohen et al., "Laser-Induced Melting of Thin Conducting Films: Part I-The Adiabatic Approximation", IEEE Transactions on Electron Devices, vol. 38, No. 9, Sep. 1991, pp. 2042-2050.

(Continued)

*Primary Examiner*—David S Blum

(57) ABSTRACT

A system and method is disclosed for using a differential wet etch stop technique to provide a uniform oxide layer over a metal layer in a laser trimmed fuse. A layer of boron doped oxide with a slow etch rate is placed over the metal layer. A layer of phosphorus doped oxide with a fast etch rate is placed over the boron doped oxide. The time period required for a wet etch process to etch through the phosphorus doped oxide is calculated. The wet etch process is then applied to the phosphorus doped oxide for the calculated time period. The wet etch process slows significantly when it reaches the boron doped oxide. This method forms a uniform layer of boron doped oxide over the metal layer.

20 Claims, 4 Drawing Sheets

U.S. PATENT DOCUMENTS

| | | | |
|---|---|---|---|
| 6,100,116 | A | 8/2000 | Lee et al. |
| 6,168,977 | B1 | 1/2001 | Konishi |
| 6,180,503 | B1 | 1/2001 | Tzeng et al. |
| 6,232,225 | B1 * | 5/2001 | Pong et al. .................. 438/640 |
| 6,284,575 | B1 | 9/2001 | Kim |
| 6,294,474 | B1 | 9/2001 | Tzeng et al. |
| 6,300,252 | B1 * | 10/2001 | Ying et al. .................. 438/723 |
| 6,307,213 | B1 | 10/2001 | Huang et al. |
| 6,399,472 | B1 | 6/2002 | Suzuki et al. |
| 6,495,470 | B2 | 12/2002 | Sadjadi et al. |
| 6,617,664 | B2 | 9/2003 | Hayashi et al. |
| 6,677,226 | B1 | 1/2004 | Bowen et al. |
| 6,759,704 | B2 | 7/2004 | Park |

OTHER PUBLICATIONS

Joseph B. Bernstein et al., "Laser Energy Limitation for Buried Metal Cuts" IEEE Electron Device Letters, vol. 19, No. 1, Jan. 1998, pp. 4-6.

Simon S. Cohen et al., "Laser-Induced Melting of Thin Conducting Films: Part II-Heat-Dissipating Substrates", IEEE Transactions on Electron Devices, vol. 38, No. 9, Sep. 1991, pp. 2051-2057.

Will R. Moore, "A Review of Fault-Tolerant Techniques for the Enhancement of Integrated Circuit Yield", Proceedings of the IEEE, vol. 74, No. 5, May 1986, pp. 684-698.

Yunlong Sun et al., "Optimization of Memory Redundancy Laser Link Processing", SPIE vol. 2636, pp. 152-164.

Don Smart et al., "Link Processing with Lasers", General Scanning Inc. 1998, pp. 1-20.

Ronald P. Cenker et al., "A Fault-Tolerant 64K Dynamic Random-Access Memory", IEEE Transactions on Electron Devices, vol. ED-26, No. 6, Jun. 1979, pp. 853-860.

A. S. Tenney et al., "Etch Rates of Doped Oxides in Solutions of Buffered HF", J. Electrochem Soc.: Solid-State Science and Technology, Aug. 1973, pp. 1091-1095.

Gang Yang, "Laser Energy Window Simulation for Metal Cut Structure" Thesis for the Degree of Master of Science, University of Maryland, 1999, 104 pages.

* cited by examiner

SYSTEM AND METHOD FOR PROVIDING A UNIFORM OXIDE LAYER OVER A LASER TRIMMED FUSE WITH A DIFFERENTIAL WET ETCH STOP TECHNIQUE This application is a divisional of prior U.S. patent application Ser. No. 10/781,166 filed on Feb. 18, 2004 now U.S. Pat. No. 7,238,620.

TECHNICAL FIELD OF THE INVENTION

The present invention is generally directed to manufacturing technology for semiconductor devices and, in particular, to a system and method for providing a uniform oxide layer over a laser trimmed fuse.

BACKGROUND OF THE INVENTION

A fuse is a circuit element that is designed to self destruct when too much current flows through the fuse. The destruction of the fuse breaks the circuit, stops the flow of current and protects other circuit elements from being damaged. In semiconductor integrated circuits a laser trim technique is used to apply laser energy to blow a fuse.

Laser trimmed fuses typically comprise a strip of aluminum metal. The strip of aluminum metal is the metal link layer that is broken when the fuse is blown. Aluminum has a relatively low melting point and a high surface tension. When the aluminum metal link layer receives laser energy the energy creates heat that melts the aluminum. The melted aluminum then vaporizes and breaks the electrical circuit through the fuse. As the melted aluminum vaporizes the melted aluminum tends to splatter.

To prevent retention of traces of metal and link splattering and to prevent standing wave effects, the metal link layer of the fuse is covered with a thin layer of oxide. The thin layer of oxide enables the melted aluminum metal to build up pressure until it explosively vaporizes through the oxide layer. The thin layer of oxide also separates the metal link layer from an upper layer of metal that contains pad connections that are accessible from outside the integrated circuit.

It is very important that the thin layer of oxide over the metal link layer be uniform in thickness. If there is no oxide at all over the metal link layer, then the metal link layer will be subject to corrosion. If the thin layer of oxide is too thin (e.g., less than two thousand Ångstroms), then cracks in the fuse may form that are likely to cause yield loss and reliability concerns. If the thin layer of oxide is too thick (e.g., more than eight thousand Ångstroms), then a high laser energy will be required to blow the fuse. The use of a high laser energy can easily lead to substrate damage, again causing yield loss and reliability concerns.

An optimum thickness for the thin layer of oxide is approximately one half of the laser wavelength. The laser wavelength is typically about one micron. A micron is equal to one millionth of a meter ($10^{-6}$ m). An Ångstrom is equal to one ten thousandth of a micron ($10^{-10}$ m). Therefore the optimum thickness for the thin layer of oxide is about five thousand Ångstroms (5000 Å).

One prior art method for creating the thin layer of oxide over the metal link layer of the fuse employs a masked partial etch-back of the passivation layers over the final layer of metal. Partial etch-back processes are difficult to control due to variations from machine to machine and due to variations over time in both deposition thicknesses and etch rates. Prior art etch-back processes are often done with an endpoint detection technique that monitors the plasma for changes in emission and/or wavelength distribution.

In laser trimming the endpoint detection method can not be used (1) because the film in question is still being etched in the entire process, and (2) because the trim structures occupy only a small percentage of the die.

Therefore, there is a need in the art for a system and method that is capable of providing a uniform oxide layer over a metal link layer of a laser trimmed fuse. In particular, there is a need in the art for a system and method that is capable of providing an oxide layer over a metal link layer of a laser trimmed fuse that is approximately five thousand Ångstroms thick.

SUMMARY OF THE INVENTION

To address the above-discussed deficiencies of the prior art, it is a primary object of the present invention to provide an efficient system and method for providing a uniform oxide layer over a metal link layer of a laser trimmed fuse.

In one advantageous embodiment of the present invention a differential wet etch stop technique is used to create the uniform oxide layer. First a metal layer is placed on a layer of a semiconductor device. The metal layer may comprise a metal link layer of a laser trimmed fuse. Then a layer of boron doped oxide is placed over the metal layer. Boron doped oxide has a relatively slow etch rate when etched by a fluoride wet etch process. The layer of the boron doped oxide is formed having a desired thickness (e.g., five thousand Ångstroms).

Then a layer of phosphorus doped oxide is placed over the boron doped oxide layer. Phosphorus doped oxide has a relatively fast etch rate when etched by a fluoride wet etch process. The phosphorus doped oxide layer is formed having a desired thickness (e.g., five thousand Ångstroms). Then a period of time T that is required for a fluoride wet etch process to etch through the phosphorus doped oxide is calculated. The calculation is made by dividing a known value of thickness of the phosphorus doped oxide layer by a known value of the etch rate for the phosphorus doped oxide layer.

Then the fluoride wet etch process is applied to the phosphorus doped oxide layer for the calculated time period T. After the fluoride wet etch process has etched through the phosphorus doped oxide layer, then the fluoride wet etch process begins to etch through the boron doped oxide layer. Because the etch rate through the boron doped oxide layer is very slow, the fluoride wet etch process slows significantly when it reaches the boron doped oxide. In comparison with the etch rate through the phosphorus doped oxide layer, the fluoride wet etch process through the boron doped oxide layer seems to come to a stop. That is, although the fluoride wet etch process continues to etch the boron doped oxide layer, the rate at which the wet etch process proceeds is minimal. This means that very little of the boron doped oxide layer will be etched if the wet etch process is terminated very soon after the time T has elapsed.

In an advantageous embodiment of the invention, the fluoride wet etch process is terminated immediately after the time T has elapsed. At this point the thickness of the boron doped oxide layer has the desired thickness (e.g., five thousand Ångstroms). In this manner the difference between the etch rates of the phosphorous doped oxide layer and the boron doped oxide layer cause the formation of a uniform layer of boron doped oxide over the metal layer.

It is an object of the present invention to provide a system and method for providing a uniform oxide layer over a metal layer in a semiconductor device.

It is also an object of the present invention to provide a system and method for using a differential wet etch stop technique to create a uniform oxide layer over a metal layer in a semiconductor device.

It is yet another object of the present invention to provide a system and method for providing a uniform oxide layer over a metal link layer in a laser trimmed fuse.

It is still another object of the present invention to provide a system and method for using a differential wet etch stop technique to create a uniform oxide layer over a metal link layer in a laser trimmed fuse.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

Figure 1:
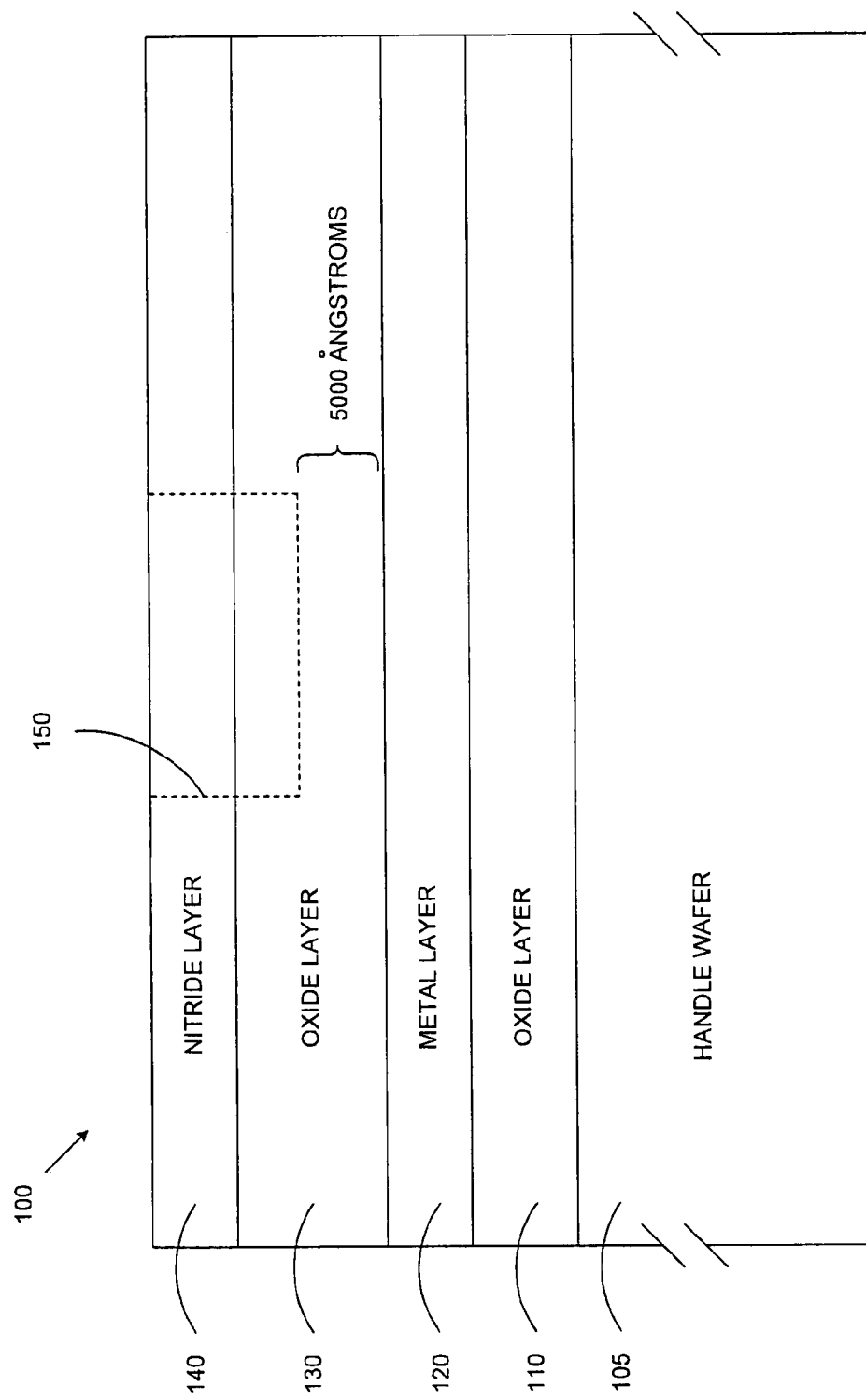
FIG. 1 illustrates a prior art semiconductor device comprising a metal layer of a laser trimmed fuse covered by an oxide layer and a nitride layer.

FIG. 1 illustrates a prior art semiconductor device 100 comprising a metal layer 120 mounted on an oxide layer 110 mounted on a handle wafer 105. Metal layer 120 of FIG. 1 may comprise a metal link layer for a laser trimmed fuse. Metal layer 120 is covered with an oxide layer 130. Oxide layer 130 is covered with a nitride layer 140.

In a typical prior art device 100 the oxide layer 130 will be thicker than five thousand Ångstroms. Also, in a typical prior art device 100 the oxide layer 130 will have one or more additional layers (such as nitride layer 140) on top of it. To reduce the thickness of, oxide layer 130 to five thousand Ångstroms, a portion of the nitride layer 140 must be etched away. Then a partial etch back must be performed on a portion of the oxide layer 130 to reduce the thickness of the selected portion of the oxide layer 130 to five thousand Ångstroms. The portions that must be etched away are shown by dotted outline 150 in FIG. 1.

Performing a partial etch back in such circumstances is difficult. Prior art etch back processes typically account for machine variability by using an endpoint detection technique. An endpoint may be detected by monitoring the plasma for changes in emission and/or wavelength distribution. In these circumstances the endpoint technique will not work because the oxide layer 130 does not change its composition when the etch process reaches the desired level of etch (i.e., five thousand Ångstroms thickness for oxide layer 130). The etch back process does not "run out" of a material that would serve to indicate that the desired level of etch has been reached. The material of oxide layer 130 both above and below the desired level of etch is the same material.

Figure 2:
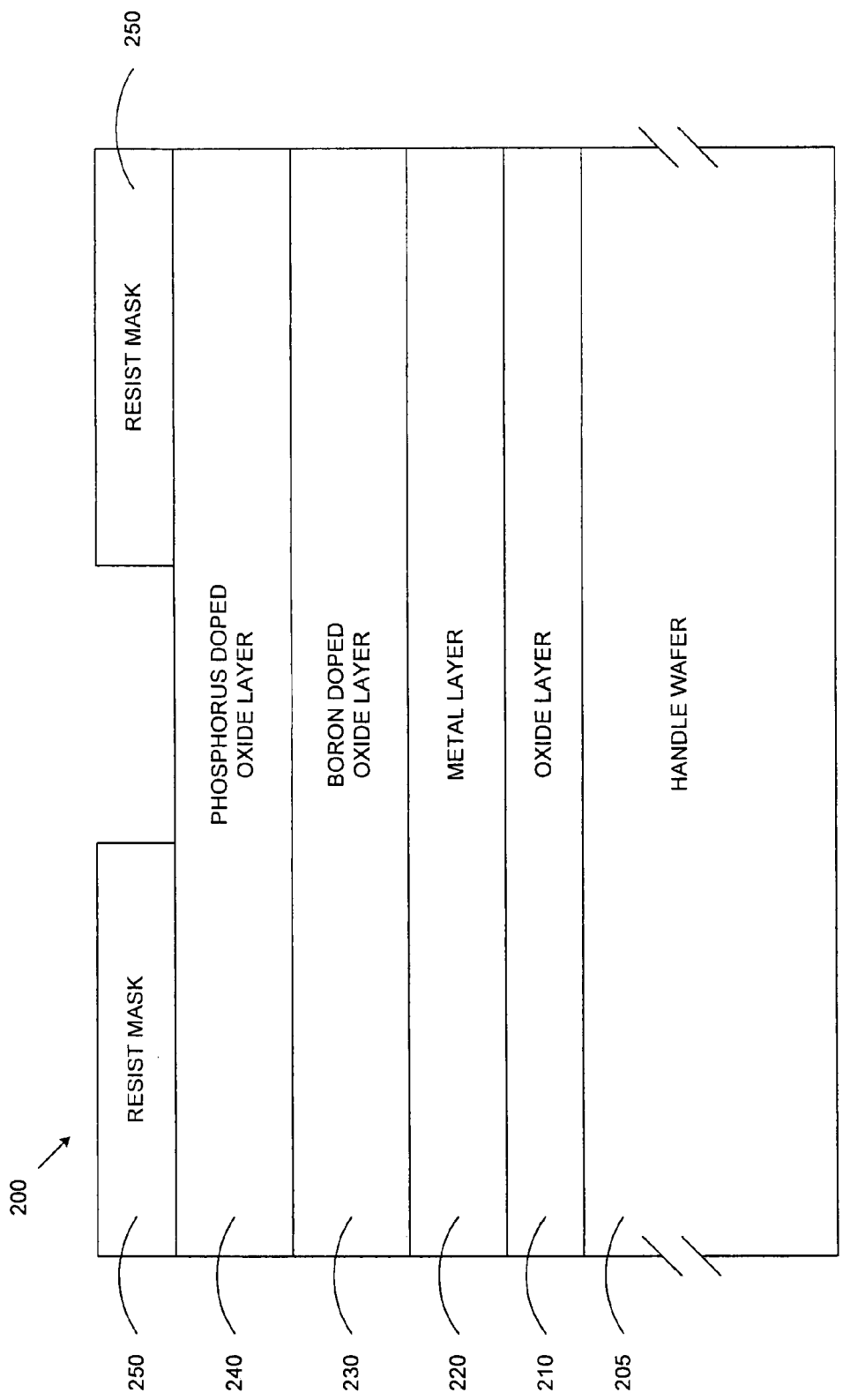
FIG. 2 illustrates a semiconductor device of the present invention comprising a metal layer of a laser trimmed fuse covered by a layer of boron doped oxide and a layer of phosphorus doped oxide.

FIG. 2 illustrates a semiconductor device 200 constructed in accordance with the principles of the present invention. In semiconductor device 200 a metal layer 220 is mounted on an oxide layer 210 mounted on a handle wafer 205. Metal layer 220 of FIG. 2 may comprise a metal link layer for a laser trimmed fuse. A boron doped oxide layer 230 is then applied over metal layer 220. When boron doped oxide layer 230 is applied over metal layer 220 the thickness of boron doped oxide layer 230 is selected to have a desired value of thickness (here, five thousand Ångstroms).

A phosphorus doped oxide layer 240 is then applied over the boron doped oxide layer 230. When phosphorous doped oxide layer 240 is applied over the boron doped oxide layer 230 the thickness of phosphorus doped oxide layer 240 is a known value. A typical value for the thickness of the phosphorus doped oxide layer 240 is five thousand Ångstroms. A resist mask 250 is then applied over the phosphorus doped oxide layer 240.

The present invention makes use of the fact that the etch rate of the phosphorus doped oxide layer 240 is significantly faster than the etch rate of the boron doped oxide layer 230. When a fluoride wet etch (e.g., ammonium fluoride or hydrogen fluoride) is applied to a phosphorus doped oxide the etch rate is approximately forty (40) times faster than the etch rate for thermal silicon dioxide. The etch rate for thermal silicon dioxide is approximately one thousand two hundred Ångstroms (1200 Å) per minute. When a fluoride wet etch is applied to a boron doped oxide the etch rate is approximately ten (10) times slower than the etch rate for thermal silicon dioxide.

Now consider the application of a fluoride wet etch to the semiconductor device 200 of the present invention. The etch rate of a fluoride wet etch on the phosphorus doped oxide layer 240 is a known quantity. The thickness of the phosphorus doped oxide layer 240 is also a known quantity. Therefore the time for the fluoride wet etch to etch through the thickness of the phosphorus doped oxide layer 240 may be calculated. Let this calculated time be designated with the letter T.

After the fluoride wet etch has etched through the phosphorus doped oxide layer 240, then the fluoride wet etch will start to etch the boron doped oxide layer 230. Because the etch rate for the fluoride wet etch on the boron doped oxide layer 230 is comparatively very slow, the etch rate almost seems to come to a "stop" compared to the previous etch rate through the phosphorus doped oxide layer 240. Although the fluoride wet etch continues to etch the boron doped oxide layer 230, the rate at which the etch process proceeds is minimal. This means that very little of the boron doped oxide layer 230 will be etched if the etch process is terminated very soon after the time T has elapsed.

Figure 3:
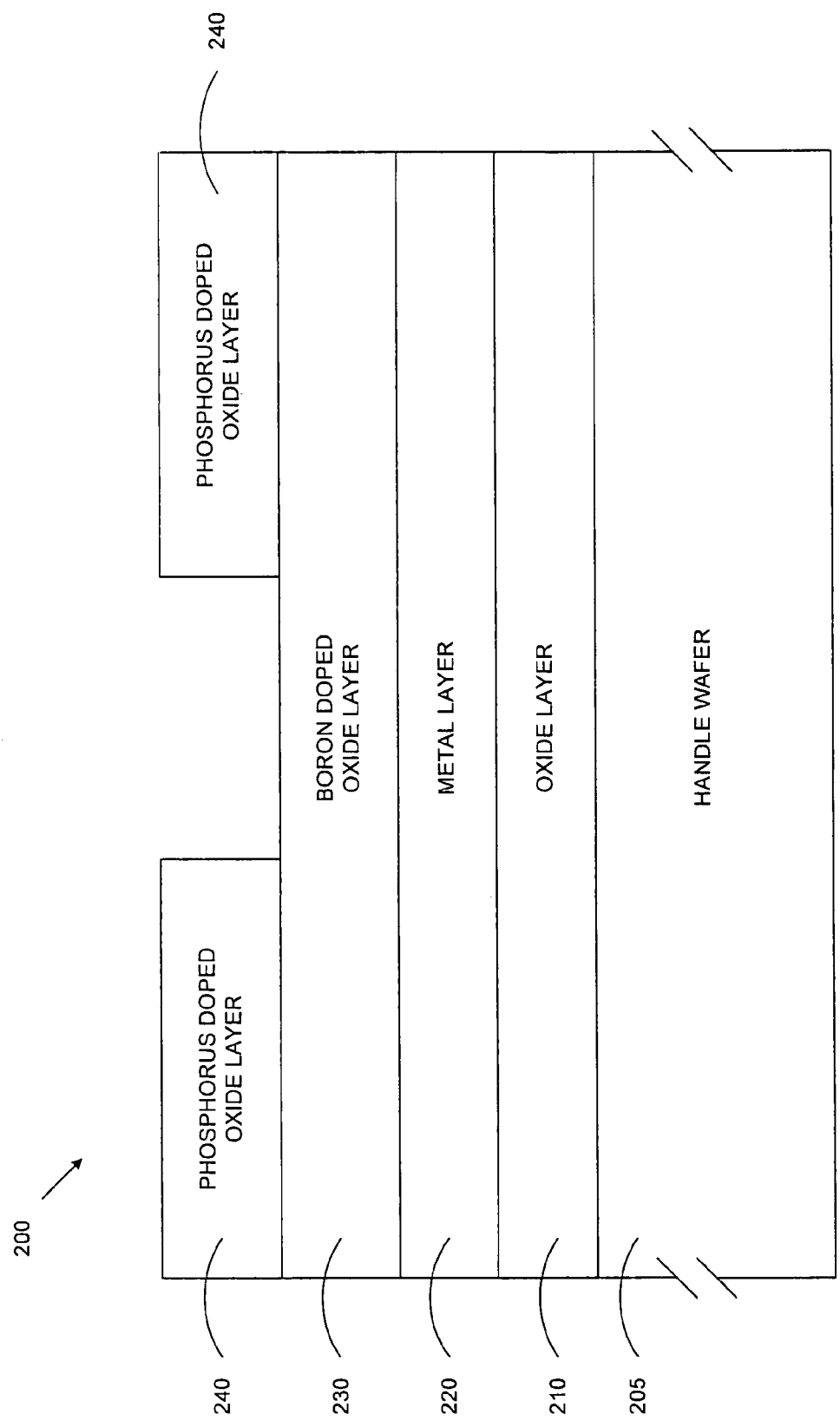
FIG. 3 illustrates the semiconductor device shown in FIG. 2 in which a portion of the layer of phosphorus doped oxide has been etched away down to the layer of boron doped oxide.

The result of stopping the wet etch process after the time T has elapsed will be that the thickness of boron doped oxide layer 230 will be uniform and have a value at the desired thickness (here, five thousand Ångstroms). The result is illustrated in FIG. 3. The portion of the phosphorus doped layer 240 that was not under resist mask 250 is etched away after time T. The boron doped oxide layer 230 substantially "stops" the wet etch process after the wet etch process reaches boron doped oxide layer 230. As previously described, the boron doped oxide layer 230 actually significantly slows the etch process because of the very slow etch rate of the boron doped oxide layer 230. The wet etch process is then terminated after time T and the resist mask 250 is removed.

Figure 4:
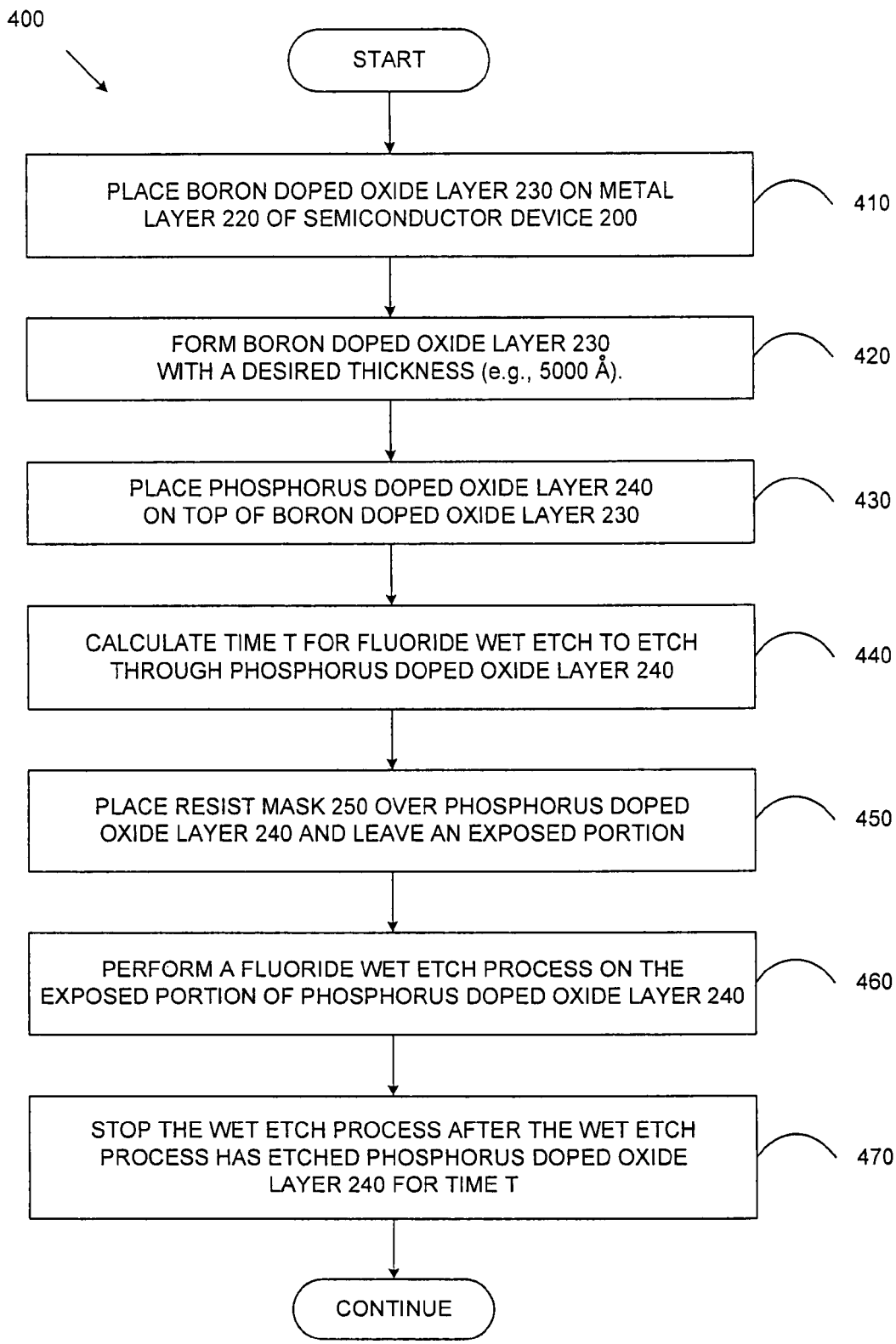
FIG. 4 illustrates a flow chart showing the steps of an advantageous embodiment of the method of the present invention.

FIG. 4 illustrates a flow chart 400 showing the steps of an advantageous embodiment of the method of the present invention. During the manufacturing of semiconductor device 200 a boron doped oxide layer 230 is placed on metal layer 220 (step 410). The thickness of the boron doped oxide layer 230 is formed having a desired thickness (e.g., five thousand Ångstroms) (step 420). Then a phosphorus doped oxide layer 240 is placed on top of the boron doped oxide layer 230 (step 430).

Then using the known fluoride wet etch rate for the phosphorus doped oxide layer 240 and the known thickness of the phosphorus doped oxide layer 240, calculate the time T for a fluoride wet etch process to etch through the thickness of the phosphorus doped oxide layer 240 (step 440). Then a resist mask 250 is placed over phosphorus doped oxide layer 240 and a portion of phosphorus doped oxide layer 240 is left exposed (step 450).

Then a fluoride wet etch process is performed on the exposed portion of the phosphorus doped oxide layer 240 (step 460). Then the wet etch process is stopped after the wet etch process has etched the phosphorus doped oxide layer 240 for the time T (step 470). The method described above creates a uniform boron doped oxide layer 230 over metal layer 220.

In an alternative advantageous embodiment of the present invention, after the fluoride wet etch has etched through the phosphorus doped oxide layer 240, the boron doped oxide layer 230 may also be etched away down to a desired thickness (albeit at a lower etch rate). The etch rate of the fluoride wet etch on the boron doped oxide layer 240 is a known quantity. The thickness of the boron doped oxide layer 240 that is to be etched away is also a known quantity. Therefore the length of time for the fluoride wet etch to etch down to the desired thickness of the boron doped oxide layer 240 may be calculated. The wet etch process is stopped after the calculated length of time has elapsed. Then the thickness of boron doped oxide layer 230 will be uniform and have a value of thickness that is equal to the desired thickness.

Although the present invention has been described with an exemplary embodiment, various changes and modifications may be suggested to one skilled in the art. It is intended that the present invention encompass such changes and modifications as fall within the scope of the appended claims.

What is claimed is:

1. An apparatus for providing a uniform oxide layer over a metal layer in a semiconductor device, said apparatus comprising:
    a semiconductor device comprising a metal layer;
    a layer of phosphorus doped oxide placed over said layer of boron doped oxide,
        wherein said layer of phosphorus doped oxide has a faster etch rate than said boron doped oxide layer, and
        wherein a portion of said layer of phosphorus doped oxide is etched and a corresponding portion of said layer of boron doped oxide remains over said metal layer,
        wherein said portion of said layer of phosphorus doped oxide is in direct contact with said corresponding portion of said layer of boron doped oxide, and
        wherein said corresponding portion of said layer of boron doped oxide is in direct contact with and placed over said metal layer.

2. The apparatus as set forth in claim 1 wherein said metal layer in said semiconductor device is a metal link layer of a laser trimmed fuse.

3. The apparatus as set forth in claim 1 wherein said layer of boron doped oxide is formed having a desired thickness.

4. The apparatus as set forth in claim 3 wherein said desired thickness of said boron doped oxide is approximately five thousand Ångstroms.

5. The apparatus as set forth in claim 1, wherein said layer of phosphorus doped oxide placed over said layer of boron doped oxide is etched through down to said layer of boron doped oxide.

6. The apparatus as set forth in claim 1 wherein said layer of phosphorus doped oxide is formed having a desired thickness.

7. The apparatus as set forth in claim 6 wherein said desired thickness of said phosphorus doped oxide is approximately five thousand Ångstroms.

8. An apparatus for providing a uniform oxide layer over a metal layer in a semiconductor device, said apparatus comprising:
    a semiconductor device comprising a metal layer;
    a layer of a first doped oxide placed over said metal layer, wherein said layer of said first doped oxide has a slower etch rate; and
    a layer of a second doped oxide placed over said layer of said first doped oxide, wherein said layer of said second doped oxide has a faster etch rate, wherein a portion of said layer of second doped oxide is etched and a corresponding portion of said layer of first doped oxide remains over said metal layer, wherein said portion of said layer of second doped oxide is in direct contact with said corresponding portion of said layer of first doped oxide, and wherein said corresponding portion of said layer of first doped oxide is in direct contact with said metal layer.

9. The apparatus as set forth in claim 8 wherein said layer of said second doped oxide placed over said layer of said first doped oxide is etched through down to said layer of said first doped oxide.

10. The apparatus as set forth in claim 9 wherein a thickness of said layer of said first doped oxide is approximately five thousand Ångstroms.

11. The apparatus as set forth in claim 10 wherein said first doped oxide is formed having said thickness of approximately five thousand Ångstroms.

12. The apparatus as set forth in claim 9 wherein said layer of said first doped oxide is etched to a desired thickness.

13. The apparatus as set forth in claim 8 wherein said metal layer in said semiconductor device is a metal link layer of a laser trimmed fuse.

14. The apparatus as set forth in claim 8 wherein said layer of said second doped oxide is formed having a desired thickness.

15. A semiconductor device, comprising:
a metal link layer of a laser trimmed fuse;
a layer of a first doped oxide placed over said metal fuse layer, wherein said layer of said first doped oxide has a first etch rate in a wet etch process; and
a layer of a second doped oxide placed directly over said layer of said first doped oxide, wherein said layer of said second doped oxide has a second etch rate in said wet etch process,
wherein said second etch rate is faster than said first etch rate, wherein said layer of the first doped oxide is formed having a desired thickness, wherein a portion of said layer of second doped oxide is etched and a corresponding portion of said layer of first doped oxide remains over said metal layer, wherein said portion of said layer of phosphorus doped oxide is in direct contact with said corresponding portion of said layer of boron doped oxide, and wherein said corresponding portion of said layer of boron doped oxide is in direct contact with said metal layer.

16. The semiconductor device as set forth in claim 15, wherein said desired thickness of said first doped oxide is approximately five thousand Ångstroms.

17. The semiconductor device as set forth in claim 15, wherein said layer of said second doped oxide is etched through down to said first doped oxide.

18. The semiconductor device as set forth in claim 17, wherein said layer of said first doped oxide is etched to a second desired thickness.

19. The semiconductor device as set forth in claim 15 wherein said layer of said second doped oxide is formed having a desired thickness.

20. The semiconductor device as set forth in claim 19 wherein said desired thickness of said layer of said second doped oxide is approximately five thousand Ångstroms.

* * * * *